(12) United States Patent
Takamura et al.

(10) Patent No.: US 8,987,737 B2
(45) Date of Patent: Mar. 24, 2015

(54) POLYCRYSTALLINE SILICON WAFER

(75) Inventors: Hiroshi Takamura, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/003,388

(22) PCT Filed: Mar. 8, 2012

(86) PCT No.: PCT/JP2012/055952
§ 371 (c)(1),
(2), (4) Date: Sep. 5, 2013

(87) PCT Pub. No.: WO2012/124596
PCT Pub. Date: Sep. 20, 2012

(65) Prior Publication Data
US 2013/0341622 A1    Dec. 26, 2013

(30) Foreign Application Priority Data

Mar. 15, 2011   (JP) .................................. 2011-056503

(51) Int. Cl.
*H01L 29/04*   (2006.01)
*C01B 33/037*   (2006.01)
(Continued)

(52) U.S. Cl.
CPC .............. *H01L 29/04* (2013.01); *C01B 33/037* (2013.01); *C30B 28/06* (2013.01); *C30B 29/06* (2013.01);
(Continued)

(58) Field of Classification Search
CPC ...... C01B 33/037; C30B 28/06; C30B 28/04; C30B 29/06; H01L 29/04; H01L 29/4232; H01L 29/7836; H01L 29/6659; H01L 31/182; H01L 31/022425; H01L 31/0747; H01L 21/02433; H01L 21/02381; Y02E 10/546; Y01E 10/50
USPC ...................... 257/49, 75, 429, 431
See application file for complete search history.

(56) References Cited

U.S. PATENT DOCUMENTS 5,965,904 A * 10/1999 Ohtani et al. .................... 257/57
6,136,091 A * 10/2000 Yamazaki et al. .............. 117/81
(Continued)

FOREIGN PATENT DOCUMENTS

JP    10-273374 A    10/1998
JP    2008-101277 A    5/2008
(Continued)

OTHER PUBLICATIONS

PXSi, Nikko Materials USE, Mar. 7, 2010.*

*Primary Examiner* — Nikolay Yushin
(74) *Attorney, Agent, or Firm* — Howson & Howson LLP

(57) ABSTRACT

Provided is a polycrystalline silicon wafer produced by a melting and unidirectional solidification method, where the polycrystalline silicon wafer has a diameter of 450 mm or more, a thickness of 900 μm or more, and an average crystal grain size of 5 to 50 mm, and is made up of one piece. The present invention provides a large-sized polycrystalline silicon wafer having a wafer size of 450 mm or more, of which: mechanical properties are similar to those of monocrystalline silicon wafers; the crystal size is large; the surface roughness is low; the surface has a high cleanliness; the polished surface has less unevenness by having a definite crystal orientation; and the sag value is similar to that of monocrystalline silicon wafers.

16 Claims, 2 Drawing Sheets

(51) Int. Cl.
  *C30B 28/06* (2006.01)
  *C30B 29/06* (2006.01)
  *H01L 31/18* (2006.01)
  *C30B 11/00* (2006.01)
  *H01L 21/02* (2006.01)

(52) U.S. Cl.
  CPC .............. *H01L 31/182* (2013.01); *C30B 11/00* (2013.01); *Y02E 10/546* (2013.01); *H01L 21/02381* (2013.01); *H01L 21/02433* (2013.01)
  USPC ........................................................ 257/49

(56) References Cited

U.S. PATENT DOCUMENTS

| | | | |
|---|---|---|---|
| 6,555,449 B1 * | 4/2003 | Im et al. | ........................ 438/487 |
| 8,236,428 B2 | 8/2012 | Satoh et al. | |
| 8,252,422 B2 | 8/2012 | Takamura et al. | |
| 2006/0225775 A1 * | 10/2006 | Ishihara | ........................ 136/244 |
| 2007/0075403 A1 | 4/2007 | Sakashita et al. | |
| 2010/0016144 A1 | 1/2010 | Suzuki et al. | |
| 2010/0187661 A1 * | 7/2010 | Suzuki et al. | .................. 257/628 |
| 2010/0330325 A1 | 12/2010 | Suzuki et al. | |
| 2012/0009374 A1 | 1/2012 | Takamura et al. | |
| 2012/0181536 A1 | 7/2012 | Suzuki et al. | |
| 2012/0187409 A1 | 7/2012 | Suzuki et al. | |

FOREIGN PATENT DOCUMENTS

| | | |
|---|---|---|
| JP | 2009-038220 A | 2/2009 |
| WO | 2004/085312 A1 | 10/2004 |
| WO | 2005-007938 A1 | 1/2005 |

* cited by examiner

POLYCRYSTALLINE SILICON WAFER

BACKGROUND

The present invention relates to an inexpensive silicon wafer of 450 mm or more prepared using a unidirectionally solidified polycrystalline silicon ingot.

The shape of a monocrystalline silicon wafer that is used in an LSI process has been increasing its diameter over time and is predicted to have a diameter of 450 mm or more in the future. In the present conditions, however, the production of a large-sized monocrystalline wafer having a diameter of 450 mm or more still has many problems in the aspects of mass production (problems such as crystal weight, pulling time, and cooling method) and of quality (problems such as crystal defect, machining defect, flatness, and surface cleanliness) and also has a difficult problem, in particular, in the aspect of cost (very expensive). Consequently, the number of wafers that can be supplied is insufficient, and the preparation for transition to the large-sized wafer is not completed at the present time.

Incidentally, not all silicon wafers are used in production of LSI chips, and the silicon wafer is also used as a dummy wafer (filler wafer), which is not necessarily a monocrystal, for production control and stabilization. In particular, under the conditions that the supply of monocrystalline wafers having a diameter of 450 mm or more is uncertain, dummy wafers that will be developed as large-sized monocrystalline wafers having a diameter of 450 mm or more are indispensable for production of various new-type semiconductors, trial manufacturing of a test apparatus, and test operation thereof. However, there are many differences between large-diameter monocrystalline silicon wafers and large-diameter polycrystalline silicon dummy wafers in surface roughness, surface cleanliness, and mechanical properties. Accordingly, expensive monocrystalline wafers must be used as dummy wafers in many cases, which is a factor causing a delay in LSI process development and an increase in cost.

Accordingly, it is an object of the present invention to provide an inexpensive polycrystalline silicon wafer that can be used as a dummy wafer having a diameter of 450 mm or more and having surface texture and mechanical properties similar to those of monocrystalline silicon wafers.

In the present invention, monocrystalline ingots produced by a Czochralski method (Cz method) or a floating zone method (FZ method) are not used, but silicon ingots produced by unidirectional solidification after heat melting are used.

Polycrystalline silicon ingots produced by a melting method have been used in wafers for solar cells in the past, but have not been used in silicon wafers of 450 mm or more for semiconductors at all. The reasons therefor are believed as follows.

In melting of an ingot for solar cells, blocks of 680 mm square or more are produced. However, the common size (cell size) of a silicon wafer for solar cells is 156 mm square, and a large number of such silicon wafers are bonded to constitute a large solar cell panel.

The reasons for each silicon wafer having a small cell size of 156 mm are, in addition to a technical difficulty of processing the silicon wafer with a large size to solar cells, a tendency of being broken if the wafer thickness is not increased with an increase in size. Also, a reduction in the thickness of the wafer is required from the viewpoint of reducing the cost, and a restriction in design of solar cell panel size in the case of a too large cell size, resulting in a reduction in usability.

The thickness of a cell wafer is usually 200 μm and has been reduced to 100 μm recently. Furthermore, a Si wafer for solar cells usually has a surface roughness Ra of 0.2 to 2 μm, and recently, in order to suppress the light reflection and to increase the photoelectric conversion efficiency, the wafer surface tends to be intentionally roughened.

In light of the crystal grain sizes of wafers, the conventional sintered silicon wafers for LSI are, as described in Patent Document 1, sintered compacts having a crystal grain size of 100 μm or less or, as described in Patent Document 2, sintered compacts having an average grain size ranging from 1 to 10 μm. Their sizes are incomparably smaller than the crystal grain size of the polycrystalline silicon according to the present invention.

In these sintered silicon dummy wafers, the strength of the wafer can be increased by controlling the transverse rupture strength, the tensile strength, and the Vickers hardness. However, there is a limitation of the wafer gravitational sag to be brought close to that of the monocrystalline silicon wafer, which is a cause of strictly limiting the use of a wafer having a diameter of 450 mm or more as a dummy wafer.

Furthermore, in light of cleanliness of wafer surface, the purity inside the raw material affecting the conversion efficiency is required to be 7 N or more in a polycrystalline silicon wafer for solar cells, but the wafer surface has been allowed to have a low purity, as long as light is not scattered by contamination. In contrast, in the sintered silicon wafer for LSI produced by sintering, though the surface is strictly washed for introducing the wafer to a semiconductor process, impurities incorporated during the production of raw material powder remain inside the material, and there is a limitation in improvement of the surface cleanliness.

Regarding the crystal orientation of polycrystalline silicon in the conventional technology, (111), (110), and (100) are the orientation of the principal planes (Patent Documents 3 and 4). The crystal grain size of an ordinary molten Si ingot is large such as several to a hundred millimeters. Consequently, there still remains a problem that macro-unevenness occurs due to a difference in polish rate caused by orientations of the crystal grains.

In addition, in the conventional technology, polycrystalline silicon used as a dummy wafer is expected to exhibit substantially the same behavior as that of monocrystalline silicon, and it is very important that the sag value does not to deviate from that of a monocrystalline silicon wafer. However, the polycrystalline silicon in Patent Documents 3 and 4 has problems also in this point. This is a cause that the polycrystalline silicon is not used as silicon dummy wafers of 450 mm or more for semiconductors.

Examples of the conventional technology of polycrystalline silicon used as dummy wafers include, as references, Patent Document 3 that proposes an inexpensive polycrystalline silicon dummy wafer having flatness and having excellent mechanical strength and thermal shock resistance by controlling the crystal orientation of polycrystalline silicon, performing CMP polishing using a masking agent, and providing a $SiO_2$ oxide thin film on the main surface of a substrate.

Furthermore, as a technology utilizing unidirectional solidification, Patent Document 4 discloses a technology for unidirectionally growing a Si-based crystal by casting, wherein a crystal piece containing Si is placed on the bottom of a crucible for cast growing, a Si raw material is placed on the crystal piece in the crucible for cast growing, the crucible for cast growing is heated to melt the Si raw material for forming a Si melt in such a manner that a part of the crystal piece remains, and then the Si melt is cooled to be solidified.
Patent Document 1: Japanese Patent Laid-Open No. 2004-289065

Patent Document 2: International Publication No. WO2009/011233
Patent Document 3: Japanese Patent Laid-Open No. 2009-38220
Patent Document 4: International Publication No. WO2005/007938

SUMMARY OF INVENTION

Technical Problem

The present invention has been made in consideration of the above and aims to provide a large-sized polycrystalline silicon wafer having a wafer size of 450 mm or more, of which: mechanical properties are similar to those of monocrystalline silicon wafers; the crystal size is large; the surface roughness is low; the surface has a high cleanliness; the polished surface has less unevenness by having a definite crystal orientation; and the sag value is similar to that of monocrystalline silicon wafers.

Solution to Problem

In order to solve the above-mentioned problems, the present inventors performed verification by repeating a manufacturing test of polycrystalline silicon and, as a result, have found that a large-sized polycrystalline silicon wafer having mechanical properties similar to those of monocrystalline silicon wafers can be obtained.

On the basis of the above-described findings, the present invention provides:
1. A polycrystalline silicon wafer produced by a melting and unidirectional solidification method, wherein the orientation of the principal plane is a (311) plane, the diameter is 450 mm or more, the thickness is 900 μm or more, the average crystal grain size is 5 to 50 mm, and the wafer is made up of one piece;
2. The polycrystalline silicon wafer according to 1 above, wherein the average surface roughness Ra is 1 nm or less; and
3. The polycrystalline silicon wafer according to 1 or 2 above, wherein the concentration of each of impurities Na, Al, Cr, Fe, Ni, and Cu on the wafer surface is less than $1\times10^{10}$ atoms/cm$^2$.

The present invention also provides:
4. The polycrystalline silicon wafer according to any one of 1 to 3 above, wherein the principal plane of the polycrystalline silicon wafer is a (311) plane, the sum of the area of the (311) plane and the area of any one or more of a (110) plane, a (551) plane, a (221) plane, a (553) plane, a (335) plane, a (112) plane, a (115) plane, and a (117) plane is 50% or more of the total area of the substrate surface, the total area of a (111) plane is less than 30% of the total area of the substrate surface, and the total area of a (100) plane is less than 10% of the total area of the substrate surface;
5. The polycrystalline silicon wafer according to any one of 1 to 4 above, wherein 30 mm or more of a side surface of a polycrystalline silicon ingot produced by unidirectional solidification is trimmed off for producing a wafer.
6. The polycrystalline silicon wafer according to any one of 1 to 5 above, wherein C and O contents of the polycrystalline silicon are respectively 100 ppm or less;
7. The polycrystalline silicon wafer according to any one of 1 to 6 above, being used as a dummy wafer; and
8. The polycrystalline silicon wafer according to any one of 4 to 6 above, wherein the plane orientation of the polycrystalline silicon wafer is measured by cutting out in such a manner that the wafer surface is within ±10° with respect to a plane perpendicular to the solidification direction.

An inexpensive dummy silicon wafer of 450 mm or more, in which the orientation of the principal plane is a (311) plane, can be produced using a unidirectionally solidified polycrystalline silicon ingot. Furthermore, the polycrystalline silicon wafer is produced by increasing the material purity and cleanliness of the wafer surface and thereby has an effect of not contaminating a process unit for semiconductor manufacturing and others when the wafer is introduced into the unit. In addition, the structure near the equiaxial chill layer, which is an outer layer of molten ingot, is trimmed off and a wafer of 450 mm or more is then extracted; thereby the wafer has an excellent effect of being suitable for introduction into a process unit due to its characteristics similar to those of monocrystals in the sagging behavior by gravity. Furthermore, the wafer has an effect of reducing the difference in level of grain boundaries occurring on the polished surface as much as possible by constituting the plane orientation of the polycrystalline silicon so that the (311) plane is substantially the principal plane.

DETAILED DESCRIPTION

Figure 1:
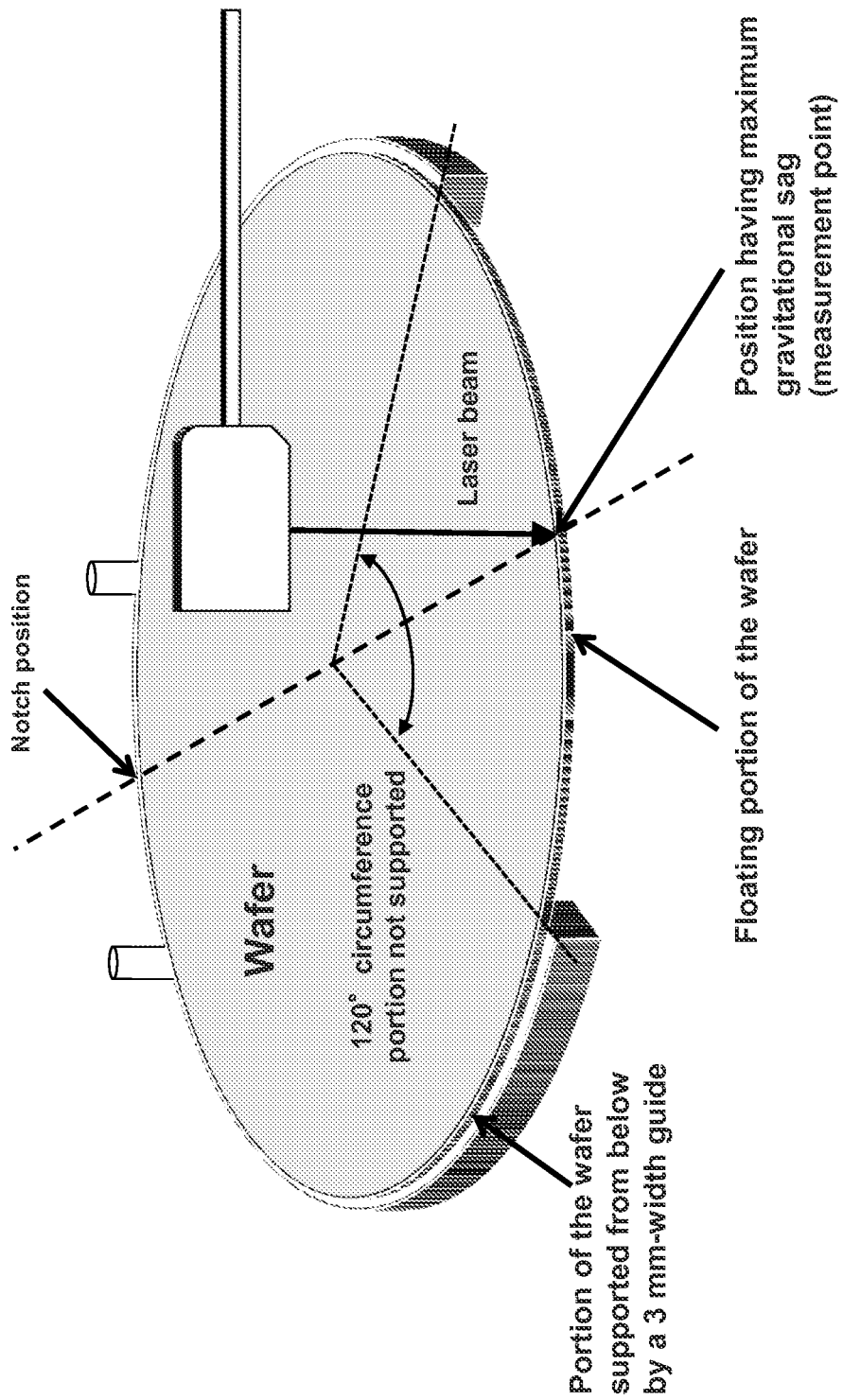
FIG. 1 This is an explanatory drawing (photograph) of a method of measuring the value of wafer gravitational sag.

The polycrystalline silicon wafer of the present invention is produced by a melting and unidirectional solidification method, and the orientation of the principal plane thereof is a (311) plane. Incidentally, since the wafer is polycrystalline silicon, various crystal orientations are observed on the wafer surface, and the orientation of the principal plane indicates the crystal orientation having the highest area ratio in the total area of wafer surface. Throughout the specification, the term "orientation of the principal plane" is used with such a meaning.

The wafer has a diameter of 450 mm or more, a thickness of 900 μm or more, and an average crystal grain size of 5 to 50 mm. Characteristically, this polycrystalline silicon wafer is not configured by combining a plurality of members, but is made up of one piece. One wafer has a diameter of 450 mm or more, which can be produced only after establishment of a technology of processing a large-sized ingot with a multi-wire saw.

In the case of using the wafer as a dummy wafer of a monocrystal, the average crystal grain size is preferably 5 to 50 mm. In addition, the strength can be improved by adjusting the thickness of the polycrystalline silicon wafer to 900 μm or more.

This polycrystalline silicon wafer can have an average surface roughness Ra of 1 nm or less. This surface roughness is achieved by performing mirror-like finishing until total reflection is provided. Conventionally, in order to suppress the reflection of light and to increase the photoelectric conversion efficiency, the wafer surface has been rather intentionally roughened. Such a method is not employed in the present invention.

Thus, the difference in level of crystal grains occurring among a large number of crystal grains specific to the polycrystalline silicon is decreased by reducing the average surface roughness Ra to 1 nm or less. This is realized by appropriately selecting the methods of grinding and polishing. Furthermore, the difference in height between adjoining crystals is desirably 20 nm or less, which is encompassed by the present invention.

The polycrystalline silicon wafer of the present invention can realize the concentration of respective impurities Na, Al, Cr, Fe, Ni, and Cu on the wafer surface to be less than $1\times10^{10}$ atoms/cm$^2$. In spite of being a polycrystalline silicon wafer, such purity can be achieved by increasing the material purity and sufficiently performing surface cleaning. Furthermore, though there are conventional problems that differences in level occur at crystal grain boundaries and at triangulation points of crystal grains so that impurities stick to the uneven portions, the improvement in purity could be achieved since the impurities can be further reduced by reducing the differences in level of crystal grains as described above to reduce the difference in height of adjoining crystals.

Furthermore, in the polycrystalline silicon wafer of the present invention, the orientation of the principal plane is a (311) plane; the sum of the area of the (311) plane and the area of any one or more of a (110) plane, a (551) plane, a (221) plane, a (553) plane, a (335) plane, a (112) plane, a (115) plane, and a (117) plane is at least 50% of the total area of the substrate surface; the total area of a (111) plane is less than 30% of the total area of the substrate surface; and the total area of a (100) plane is less than 10% of the total area of the substrate surface.

It was found that the plane perpendicular to the solidification direction of a Si ingot lies substantially in the (311) direction when the Si ingot is produced by unidirectional solidification at a solidification rate of 0.45 to 0.65 mm/min using a silica crucible, of which the inner wall has a surface roughness in a range of 300 to 700 μm and the bottom portion (the bottom surface is planate) is provided with a sputter-deposited high-purity (99.9999% or more) silicon film having a thickness of 10 to 30 μm. The occurrence of macro-unevenness on the polished surface can be more efficiently prevented by making the (311) plane to be the front or back surface of a silicon wafer. Incidentally, it is difficult to control so that the orientation of the principal plane is a (311) plane when the material of the crucible, the surface roughness of the inner wall of the crucible, the sputtered silicon film on the bottom portion of the crucible, and the solidification rate deviate from the above-mentioned ranges.

Furthermore, the polycrystalline silicon wafer of the present invention is desirably produced by removing 30 mm or more of a side surface of a polycrystalline silicon ingot produced by unidirectional solidification. In order to have a sag value similar to that of monocrystalline silicon wafers, it is desirable to secure a diameter of 450 mm even after removing 30 mm or more of a side surface of a polycrystalline silicon ingot as described above, which can be achieved by the present invention.

Furthermore, in the polycrystalline silicon wafer of the present invention, it is desirable that the C and O contents in the polycrystalline silicon portion are 100 ppm or less respectively. In addition, the plane orientation of the polycrystalline silicon wafer is preferably measured by cutting out in such a manner that the wafer surface is within ±10° with respect to a plane perpendicular to the solidification direction.

The polycrystalline silicon wafer described above has a high mechanical strength and high workability and thereby can be used not only as a mechanical wafer (or dummy wafer) but also as a sputtering target or various parts such as a holder of semiconductor manufacturing equipment.

From the above, even in a large-sized polycrystalline silicon wafer, a wafer size of 450 mm, a large crystal size, a low surface roughness, a high cleanliness of the wafer surface, a less unevenness of the polished surface by having a definite crystal orientation, and a sag value similar to that of monocrystalline silicon wafers can be achieved.

As a result, it is possible to obtain a large-sized polycrystalline silicon wafer having mechanical properties similar to those of monocrystalline silicon wafers and to provide a large-sized polycrystalline silicon wafer having mechanical properties similar to those of monocrystalline silicon that is used as a mechanical wafer. Furthermore, since the polycrystalline silicon wafer has a high strength, a considerable characteristic that the yield is notably improved to reduce the manufacturing cost is provided.

EXAMPLES

The present invention will now be described on the basis of Examples. The following Examples are intended to facilitate understanding of the present invention, and the present invention is not limited to these Examples. That is, other examples and modifications based on the technical idea of the present invention are included in the present invention as a matter of course. In addition, for comparison, Comparative Examples are also shown.

Examples 1 to 3 and Comparative Example 3

A silicon ingot having a purity of 6 N was produced by unidirectional solidification at a solidification rate of 0.55 mm/min using a silica crucible, of which the inner wall has a surface roughness in a range of 300 to 700 μm and the bottom portion (the bottom surface is planate) is provided with a sputter-deposited high-purity (99.9999% or more) silicon film having a thickness of 10 to 30 μm On this occasion, the outer diameter of the ingot was adjusted to ϕ510 mm. The orientation of the principal plane, which is the plane perpendicular to the solidification direction of the ingot, was the (311) plane; the sum of the area of the (311) plane and the area of any one or more of the (110) plane, the (551) plane, the (221) plane, the (553) plane, the (335) plane, the (112) plane, the (115) plane, and the (117) plane was at least 50% of the total area of the substrate surface; the total area of the (111) plane was less than 30% of the total area of the substrate surface; and the total area of the (100) plane was less than 10% of the total area of the substrate surface.

Subsequently, this polycrystalline silicon ingot having a columnar structure was subjected to external cylindrical grinding so as to have a diameter of 450 mm, slicing with a multi-wire saw so as to have a thickness of about 1 mm, grinding, polishing, and then mirror finishing, and washing treatment. On this occasion, the angle of the wafer surface with respect to a plane perpendicular to the solidification direction was adjusted to be +0.005° in Example 1, +5.600° in Example 2, +9.980° in Example 3, and −10.850° in Comparative Example 3.

Example 4 and Comparative Examples 4 and 5

Silicon ingots were produced as in Example 1 except that the outer diameters of the ingots were ϕ 550 mm in Example 4, ϕ 470 mm in Comparative Example 4, and ϕ490 mm in Comparative Example 5.

Subsequently, the polycrystalline silicon ingots having a columnar structure were each subjected, as in Example 1, to external cylindrical grinding so as to have a diameter of 450 mm, slicing with a multi-wire saw so as to have a thickness of about 1 mm, grinding, polishing, and then mirror finishing, and washing treatment. On this occasion, the angle of the wafer surface with respect to a plane perpendicular to the solidification direction was adjusted to be −0.001° in Example 4, −0.002° in Comparative Example 4, and +0.004° in Comparative Example 5.

surement of the center of the floating wafer circumference portion as the position showing the maximum gravitational sag, and comparing the value with that obtained by laser measurement of the notch position on the opposite side. The results are shown in Table 1.

TABLE 1

| | Ingot size (mm) | Thickness of removed outer layer (mm) | Angle of wafer surface with respect to plane perpendicular to solidification direction (°) | Average surface roughness Ra (nm) | Analysis of impurities on wafer surface (×E10 atoms/cm²) | | | | | Maximum gravitational sag (μm) |
|---|---|---|---|---|---|---|---|---|---|---|
| | | | | | Na | Al | Fe | Ni | Cu | |
| Example 1 | 510 | 30 | +0.005 | 0.08 | <1 | <1 | <1 | <1 | <1 | 640 |
| Example 2 | 510 | 30 | +5.600 | 0.77 | <1 | <1 | <1 | <1 | <1 | 638 |
| Example 3 | 510 | 30 | +9.980 | 0.95 | <1 | <1 | <1 | <1 | <1 | 646 |
| Example 4 | 550 | 50 | −0.001 | 0.13 | <1 | <1 | <1 | <1 | <1 | 645 |
| Comparative Example 1 | 510 | 30 | −0.002 | 1.9 | <1 | <1 | 4.8 | <1 | 1.2 | 562 |
| Comparative Example 2 | — | — | — | 300 | 64 | 360 | 3200 | 47 | 1500 | 567 |
| Comparative Example 3 | 510 | 30 | −10.850 | 1.5 | <1 | <1 | <1 | <1 | <1 | 650 |
| Comparative Example 4 | 470 | 10 | −0.002 | 0.1 | <1 | <1 | <1 | <1 | <1 | 580 |
| Comparative Example 5 | 490 | 20 | +0.004 | 0.09 | <1 | <1 | <1 | <1 | <1 | 610 |

Note:
Maximum gravitational sag is the average value for 20 wafers

Comparative Example 1

A silicon ingot was produced by unidirectional solidification at a solidification rate of 1 mm/min using a quartz glass crucible having a surface roughness of about 200 μm. On this occasion, the outer diameter of the ingot was adjusted to φ510 mm. The orientation of the principal plane, which is the plane perpendicular to the solidification direction of the ingot, was the (111) plane.

Subsequently, the polycrystalline silicon ingot having a columnar structure was subjected, as in Example 1, to external cylindrical grinding so as to have a diameter of 450 mm, slicing with a multi-wire saw so as to have a thickness of about 1 mm, grinding, polishing, and then mirror finishing, and washing treatment. On this occasion, the angle of the wafer surface with respect to a plane perpendicular to the solidification direction was adjusted to be −0.002°.

Comparative Example 2

A wafer (commercial product) having a surface roughness Ra of 300 nm (0.3 μm) and not subjected to mirror finishing, which is commonly used in solar cells, was prepared. The orientation of the principal plane of the wafer surface was the (100) plane. The wafer was subjected to surface washing under the same washing conditions as those in Example 1.

Figure 3:
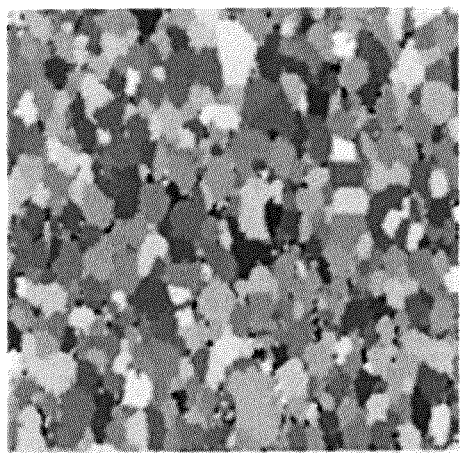
FIG. 3 This is an image of the arrangement of crystal grains of polycrystalline silicon wafer of the present invention photographed with an electron back scattering pattern (EBSP) analyzer.

The wafers prepared above were subjected to analysis or measurement of surface roughness, impurities on the surface, and maximum gravitational sag. The maximum gravitational sag was determined, as shown in FIG. 1, by supporting the rim of the 240° of the wafer circumference from below by a 3 mm-wide guide, maintaining the rim of the remaining circumference of 120° in a floating state, performing laser mea- As shown in Table 1, the values of average surface roughness Ra in Examples 1 to 4 were 0.08 nm, 0.77 nm, 0.95 nm, and 0.13 nm, respectively, which were all not higher than 1 nm. FIG. 3 shows a photograph of the arrangement of crystal grains of the wafer surface in Example 1. Furthermore, the results of impurity analysis of each wafer surface demonstrate that the concentrations of impurities, Na, Al, Fe, Ni, and Cu, were each less than $1 \times 10^{10}$ atoms/cm².

Though it is not shown in Table 1, analysis of Cr gave similar results. The values of maximum gravitational sag in Examples 1 to 4 were 640 μm, 638 μm, 646 μm, and 645 μm, respectively, which approximated the sag, 642 μm, of a 450-millimeter monocrystalline wafer.

The high-purity polycrystalline silicon wafers shown in Examples 1 to 4 could be introduced into a semiconductor processing unit without causing any problem.

In contrast, in Comparative Example 1, the average surface roughness Ra was 1.9 nm, and the results of impurity analysis of the wafer surface demonstrate that though the concentrations of impurities, Na, Al, and Ni, were each less than $1 \times 10^{10}$ atoms/cm², the concentrations of impurities, Fe and Cu, increased to $4.8 \times 10^{10}$ atoms/cm² and $1.2 \times 10^{10}$ atoms/cm², respectively. There is a tendency that a high-purity wafer that can be introduced into a semiconductor processing unit becomes difficult to obtain if the surface roughness Ra is higher than 1 nm.

The maximum gravitational sag was 562 μm, which deviates from the sag, 642 μm, of a 450-millimeter monocrystalline wafer. It was determined that introduction of the polycrystalline silicon wafer shown in Comparative Example 1 to a semiconductor processing unit is inadequate.

In Comparative Example 2, the average surface roughness Ra was 300 nm, and the results of impurity analysis of the wafer surface demonstrated significant increases such that the Na concentration was $64 \times 10^{10}$ atoms/cm², the Al concentration was $360 \times 10^{10}$ atoms/cm², the Fe concentration was $3200 \times 10^{10}$ atoms/cm², the Ni concentration was $47 \times 10^{10}$ atoms/cm², and the Cu concentration was $1500 \times 10^{10}$ atoms/ cm². The maximum gravitational sag was 567 µm, which deviates from the sag, 642 µm, of a 450-millimeter monocrystalline wafer.

It was determined that introduction of the polycrystalline silicon wafer shown in Comparative Example 2 to a semiconductor processing unit is impossible.

In Comparative Example 3, the average surface roughness Ra was 1.5 nm, and the maximum gravitational sag was 650 µm. Both values were slightly higher than those in Examples 1 to 4. In the case of a large surface roughness, the wafer is inadequate as a dummy wafer, in particular, for wet process such as washing.

In Comparative Examples 4 and 5, the values of the maximum gravitational sag were respectively 580 µm and 610 µm, which were less than that of a monocrystalline wafer. The removal of the outer layer was 30 mm or less, which was insufficient. As a result, a fine structure such as an equiaxial chill layer segregated in a ring shape and remained at the wafer rim, which causes deviation from the sag, 642 µm, of a 450-millimeter monocrystalline wafer to the smaller side.

The ingots produced in these Examples and Comparative Examples were all cylindrical, but ingots molten in a square shape showed the same results.

When a wafer surface (other than the side faces) is within ±10° with respect to a plane perpendicular to the solidification direction of a silicon ingot produced by unidirectional solidification, many of the crystal grains have the principal orientation in the (311) plane to reduce the difference in level among the crystal grains in the wafer.

Figure 2:
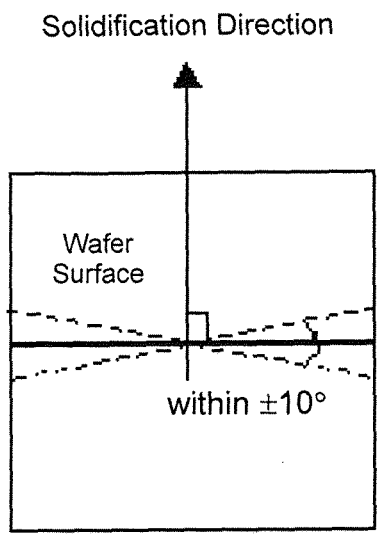
FIG. 2 This is an explanatory drawing illustrating the conception that a wafer surface is within ±10° with respect to a plane perpendicular to the solidification direction of a silicon ingot.

FIG. 2 is an explanatory drawing illustrating the conception that a wafer surface is within ±10° with respect to a plane perpendicular to the solidification direction of a silicon ingot. FIG. 3 shows crystal grains of a polycrystalline silicon wafer. A large number of crystal grains having the principal orientation in the (311) plane are observed. If crystal grains face various directions, the etching rate varies depending on each crystal orientation. Consequently, differences in level occur everywhere to provide a wafer having much unevenness.

In the present invention, the polycrystalline silicon wafer is produced by increasing the material purity and cleanliness of the wafer surface, and therefore, has an effect of not contaminating a process unit for semiconductor manufacturing and others when the wafer is introduced into the unit. In addition, the structure near the equiaxial chill layer, which is an outer layer of molten ingot, is trimmed off and a wafer of 450 mm or more is then extracted; thereby the wafer has an excellent effect of being suitable for introduction into a process unit due to its characteristics similar to those of monocrystals in the sagging behavior by gravity. Furthermore, the wafer has an effect of reducing the difference in level of grain boundaries occurring on the polished surface as much as possible by constituting the plane orientation of the polycrystalline silicon so that the (311) plane is substantially the principal plane. Thus, the polycrystalline silicon wafer of the present invention produced using a unidirectionally solidified polycrystalline silicon ingot is inexpensive and is useful as a large-scaled polycrystalline silicon wafer of 450 mm or more, in particular, as a dummy silicon wafer.

The invention claimed is:

1. A polycrystalline silicon wafer produced by a melting and unidirectional solidification method, wherein an orientation of a principal plane which is a plane perpendicular to a solidification direction of a polycrystalline silicon ingot is a (311) plane, a diameter is 450 mm or more, a thickness is 900 µm or more, an average crystal grain size is 5 to 50 mm, and the wafer is made up of one piece.

2. The polycrystalline silicon wafer according to claim 1, wherein an average surface roughness Ra is 1 nm or less.

3. The polycrystalline silicon wafer according to claim 2, wherein a concentration of each of impurities, Na, Al, Cr, Fe, Ni, and Cu, on a surface of the polycrystalline silicon wafer is less than $1 \times 10^{10}$ atoms/cm².

4. The polycrystalline silicon wafer according to claim 3, wherein: the principal plane of the polycrystalline silicon wafer is a (311) plane; a sum of an area of the (311) plane and an area of any one or more of a (110) plane, a (551) plane, a (221) plane, a (553) plane, a (335) plane, a (112) plane, a (115) plane, and a (117) plane is 50% or more of a total area of a substrate surface; a total area of a (111) plane is less than 30% of the total area of the substrate surface; and a total area of a (100) plane is less than 10% of the total area of the substrate surface.

5. The polycrystalline silicon wafer according to claim 4, wherein 30 mm or more of a side surface of the polycrystalline silicon ingot produced by unidirectional solidification is trimmed off for producing the polycrystalline silicon wafer.

6. The polycrystalline silicon wafer according to claim 5, wherein C and O contents of the polycrystalline silicon wafer are respectively 100 ppm or less.

7. The polycrystalline silicon wafer according to claim 6, being used as a dummy wafer.

8. The polycrystalline silicon wafer according to claim 6, wherein a plane orientation of the polycrystalline silicon wafer is measured by cutting out in such a manner that the surface of the polycrystalline silicon wafer is within ±10° with respect to a plane perpendicular to the solidification direction of the polycrystalline silicon ingot.

9. The polycrystalline silicon wafer according to claim 1, wherein a concentration of each of impurities, Na, Al, Cr, Fe, Ni, and Cu, on a surface of the polycrystalline silicon wafer is less than $1 \times 10^{10}$ atoms/cm².

10. The polycrystalline silicon wafer according to claim 1, wherein: the principal plane of the polycrystalline silicon wafer is a (311) plane; a sum of an area of the (311) plane and an area of any one or more of a (110) plane, a (551) plane, a (221) plane, a (553) plane, a (335) plane, a (112) plane, a (115) plane, and a (117) plane is 50% or more of a total area of a substrate surface; a total area of a (111) plane is less than 30% of the total area of the substrate surface; and a total area of a (100) plane is less than 10% of the total area of the substrate surface.

11. The polycrystalline silicon wafer according to claim 10, wherein a plane orientation of the polycrystalline silicon wafer is measured by cutting out in such a manner that a surface of the polycrystalline silicon wafer is within ±10° with respect to a plane perpendicular to the solidification direction of the polycrystalline silicon ingot.

12. The polycrystalline silicon wafer according to claim 1, wherein 30 mm or more of a side surface of the polycrystalline silicon ingot produced by unidirectional solidification is trimmed off for producing the polycrystalline silicon wafer.

13. The polycrystalline silicon wafer according to claim 12, wherein the principal plane orientation of the polycrystalline silicon wafer is measured by cutting out in such a manner that a surface of the polycrystalline silicon wafer is within ±10° with respect to a plane perpendicular to the solidification direction of the polycrystalline silicon ingot.

14. The polycrystalline silicon wafer according to claim 1, wherein C and O contents of the polycrystalline silicon wafer are respectively 100 ppm or less.

15. The polycrystalline silicon wafer according to claim 14, wherein a plane orientation of the polycrystalline silicon wafer is measured by cutting out in such a manner that a surface of the polycrystalline silicon wafer is within ±10° with respect to a plane perpendicular to the solidification direction of the polycrystalline silicon ingot.

16. The polycrystalline silicon wafer according to claim 1, wherein the polycrystalline silicon wafer is a dummy wafer.

* * * * *